United States Patent
Rai et al.

(10) Patent No.: US 8,630,133 B2
(45) Date of Patent: Jan. 14, 2014

(54) MEMORY DEVICE

(75) Inventors: Toshiki Rai, Ogaki (JP); Sadao Yoshikawa, Yoro-cho (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 197 days.

(21) Appl. No.: 13/029,892

(22) Filed: Feb. 17, 2011

(65) Prior Publication Data

US 2011/0205795 A1 Aug. 25, 2011

(30) Foreign Application Priority Data

Feb. 23, 2010 (JP) .................................. 2010-036994

(51) Int. Cl.
 *G11C 7/00* (2006.01)
(52) U.S. Cl.
 USPC ...................................................... 365/189.15
(58) Field of Classification Search
 USPC ...................................................... 365/189.15
 See application file for complete search history.

(56) References Cited

U.S. PATENT DOCUMENTS

| | | | |
|---|---|---|---|
| 6,038,185 A | * | 3/2000 | Ng et al. ........................ 365/221 |
| 2001/0021117 A1 | * | 9/2001 | Cavaleri et al. ..................... 365/1 |
| 2010/0118624 A1 | * | 5/2010 | Kaneko .................... 365/189.15 |

FOREIGN PATENT DOCUMENTS

WO  WO-99/59154  11/1999

* cited by examiner

*Primary Examiner* — Huan Hoang
*Assistant Examiner* — Min Huang
(74) *Attorney, Agent, or Firm* — Morrison & Foerster LLP

(57) ABSTRACT

With a serial interface memory device of this invention, a read-out rate of data is increased, while an increase in a size of a circuit is suppressed. An EEPROM is provided with a memory cell array storing data, a row address decoder and a column address decoder that select an address of the memory cell array in accordance with an address signal serially inputted in synchronization with a clock, sense amplifiers SA0-SA5, SA_M0 and SA_M1 each provided corresponding to each bit of the data, and a shift register that outputs the data read out from the sense amplifiers serially from a first bit. The column address decoder commences reading out two candidate data for the first bit by inputting each of the two candidate data to each of the two sense amplifiers SA_M0 and SA_M1, respectively, before all bits of the column address signal are established.

10 Claims, 7 Drawing Sheets

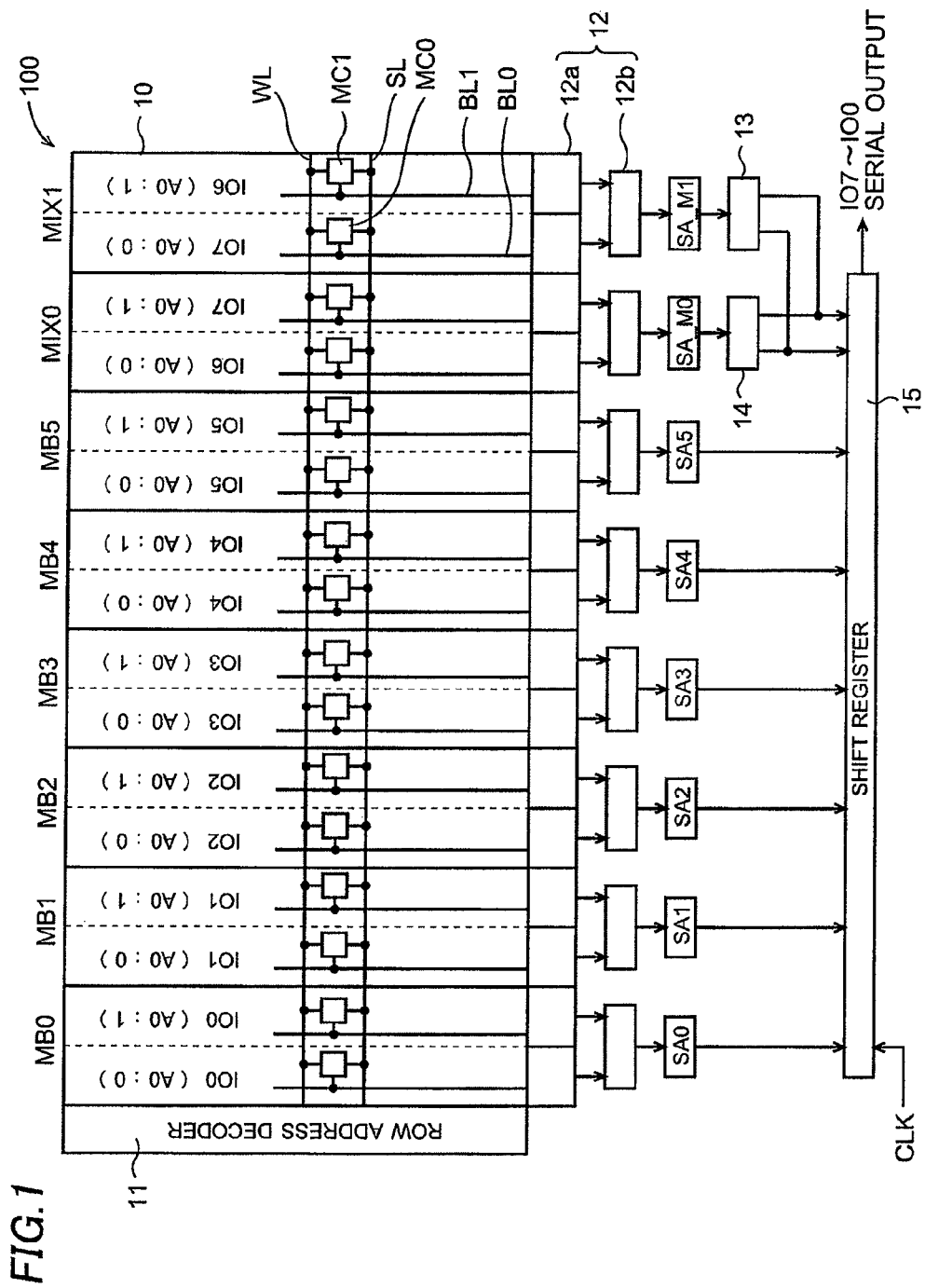

PHASE 1

PHASE 2

PHASE 3

PHASE 4

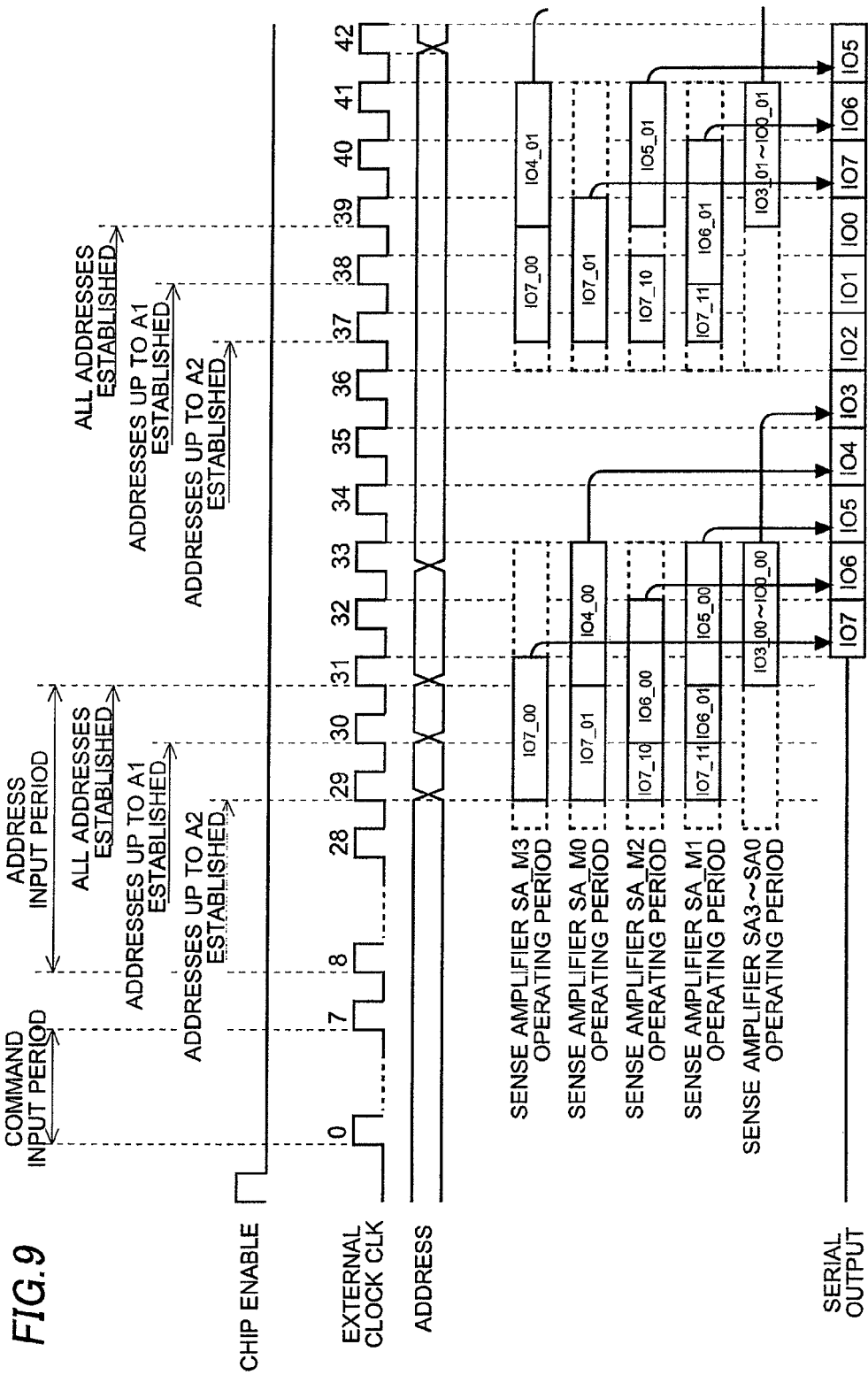

MEMORY DEVICE

CROSS-REFERENCE OF THE INVENTION

This application claims priority from Japanese Patent Application No. 2010-36994, the content of which is incorporated herein by reference in its entirety.

BACKGROUND OF THE INVENTION

1. Field of the Invention

This invention relates to a serial interface memory device that outputs data serially.

2. Description of the Related Art

In general, in the serial interface memory device, an address signal is serially inputted in synchronization with a rising edge of an external clock. The serial interface memory device is configured so that data stored in a memory cell array at an address defined by the address signal is read out with a sense amplifier when a last bit of the address signal is inputted in synchronization with the rising edge of the external clock, and the data is serially outputted from a first bit in synchronization with a falling edge of the external clock. A memory device of an eight-bit data width is configured to output eight-bit data serially, for example.

There is a limit to increasing a read-out rate, however, since the serial interface memory device is required by its specifications to read out the first bit data and start outputting the data within a ½ clock period after the last bit of the address signal is established.

Thus, there is conceived a method in which data at two candidate addresses are read ahead when the address signal of a bit that is one bit ahead of the last bit is inputted. Out of the data at the two candidate addresses which have been read ahead, data at an eventually determined address is outputted after the last bit of the address signal is established. In order to read ahead the data at the two candidate addresses, there are provided two sense amplifiers that correspond to the two addresses (Refer to Japanese Unexamined Patent Publication No. 2002-515628, for example.).

In the conventional serial interface memory device, however, there is a problem that its circuit becomes large and a size of a semiconductor die is increased, because the sense amplifiers to read ahead the data at the candidate addresses are additionally provided.

SUMMARY OF THE INVENTION

This invention provides a memory device having a memory cell array to store data, an address decoder selecting an address of the memory cell array corresponding to an address signal serially inputted in synchronization with a clock, a plurality of read-out circuits each corresponding to each bit of the data, a shift register serially outputting the data read out from the plurality of read-out circuits from its first bit in synchronization with the clock, wherein the address decoder inputs each of a plurality of candidate data for the first bit to each of the same number of the read-out circuits as the number of the plurality of candidate data, respectively, before all bits of the address signal are established, so that reading out the plurality of candidate data is commenced before all bits of the address signal are established.

BRIEF DESCRIPTION OF THE DRAWINGS

FIG. 1 shows a structure of an EEPROM according to a first embodiment of this invention.

FIG. 9 is a timing chart to explain operations of the EEPROM according to the second embodiment of this invention.

DETAILED DESCRIPTION OF THE INVENTION

Figure 2A:
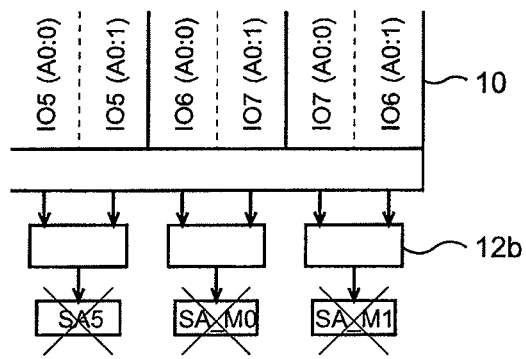
FIGS. 2A, 2B, 2C and 2D are to explain operations of the EEPROM according to the first embodiment of this invention.
Figure 2B:
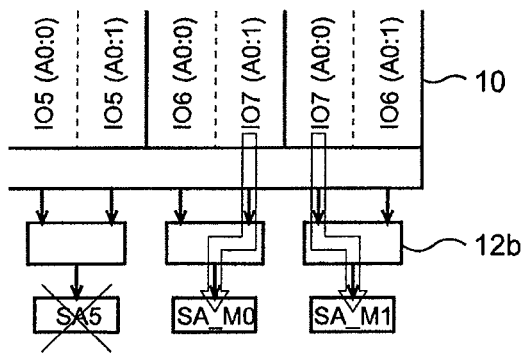
Figure 2C:
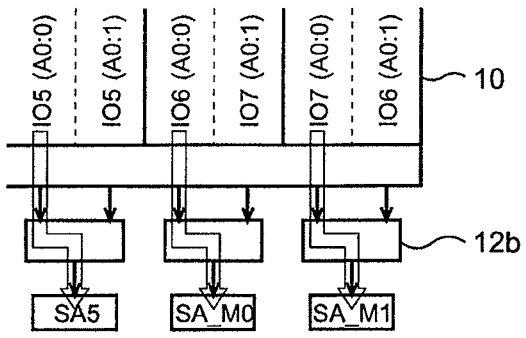

A serial interface EEPROM (Electrically Erasable PROM) 100 according to a first embodiment of this invention will be described referring to the drawings.

An overall structure of the EEPROM 100 will be described referring to FIG. 1. The EEPROM 100 is formed to include a memory cell array 10, a row address decoder 11, a column address decoder 12, eight sense amplifiers SA0-SA5, SA_M0 and SA_M1 to read out data, selectors 13 and 14, and a shift register 15. The column address decoder 12 is composed of a first column address decoder 12a and a second column address decoder 12b.

The EEPROM 100 has a data width of eight bits. The memory cell array 10 includes eight memory blocks MB0-MB5, MIX0 and MIX1 corresponding to eight bits of data IO7-IO0, which correspond to the data width of eight-bits. The data IO7-IO0 are serially outputted in the order of IO7→IO6→IO5→IO4→IO3→IO2→IO1→IO0. In this case, the data IO7 in the most significant bit makes data of a first bit.

In the memory blocks MB0-MB5, there are disposed memory cells each corresponding to each of the data IO0-IO5, respectively. In the memory blocks MIX0 and MIX1, on the other hand, there are disposed memory cells corresponding to the data IO6 and IO7 in cross combination. That is, data IO6(A0:0) that corresponds to A0=0 and data IO7(A0:1) that corresponds to A0=1 are stored in the memory block MIX0, where A0 is the least significant bit of a column address signal Ai. The least significant bit column address signal A0 corresponds to a last inputted bit of the column address signal Ai that is inputted serially.

On the other hand, data IO7(A0:0) that corresponds to A0=0 and data IO6(A0:1) that corresponds to A0=1 are stored in the memory block MIX1. Each of the eight sense amplifiers SA0-SA5, SA_M0 and SA_M1 is provided corresponding to each of the eight memory blocks MB0-MB5, MIX0 and MIX1, respectively.

Although a large number of memory cells are disposed in a matrix form in each of the memory blocks MB0-MB5, MIX0 and MIX1, FIG. 1 shows only memory cells MC0 at the addresses corresponding to A0=0 and memory cells MC1 at the addresses corresponding to A0=1. In the memory block MIX1, for example, the data IO7(A0:0) is stored in the memory cell MC0 and the data IO6(A0:1) is stored in the memory cell MC1.

The memory cell MC0 is connected to a word line WL and a bit line BL0, while the memory cell MC1 is connected to the word line WL and a bit line BL1. Also, the memory cells MC0 and MC1 are connected to a common source line SL.

The row address decoder 11 selects out of a plurality of word lines a word line corresponding to a row address signal that is serially inputted in synchronization with an external clock CLK, and outputs an H level signal to the selected word line.

Also, the column address decoder 12 selects a bit line corresponding to each of M bits of the column address signal Ai (i=0–n, M=n+1), which is serially inputted in synchronization with the external clock CLK. The column address signal Ai is inputted to the column address decoder 12 in the order from the most significant bit column address signal An to the least significant bit column address signal A0.

The first column address decoder 12a selects the bit lines BL0 and BL1 when the column address signal A1, which is one bit more significant than the least significant bit column address signal A0, is established. What is described above applies to all the eight memory blocks MB0-MB5, MIX0 and MIX1.

As for each of the six memory blocks MB0-MB5, the second column address decoder 12b selects either the bit line BL0 or the bit line BL1 based on the least significant bit column address signal A0 when it is established, and connects the selected bit line to an input terminal of corresponding each of the sense amplifiers SA0-SA5, respectively.

As for the memory blocks MIX0 and MIX1, on the other hand, the second column address decoder 12b makes characteristic operations. That is, the second column address decoder 12b connects the bit line BL0, that corresponds to IO7(A0:0) in the memory block MIX1, to an input terminal of the sense amplifier SA_M1 and connects the bit line BL1, that corresponds to IO7(A0:1) in the memory block MIX0, to an input terminal of the sense amplifier SA_M0, when the column address signal A1 is established.

That is, before the least significant bit column address signal A0 is established, IO7(A0:0) and IO7(A0:1), that are two candidate data for the first bit determined by the column address signal A1 and more significant bits of the column address signal Ai, are inputted to the sense amplifiers SA_M1 and SA_M0 to put the sense amplifiers SA_M1 and SA_M0 into operation.

And when the least significant bit column address signal A0 is established, the second column address decoder 12b continues inputting either IO7(A0:0) or IO7(A0:1) to the corresponding sense amplifier, depending on the established least significant bit column address signal A0. As a result, the corresponding sense amplifier continues the operation to read out the data, that is, continues detection of the data.

At that time, the second column address decoder 12b switches so as to apply either IO6(A0:0) or IO6(A0:1) to the other sense amplifier, depending on the established least significant bit column address signal A0. As a result, the read-out operation of the data by the other sense amplifier is commenced.

For example, when the column address signal A0 is established to be "0", the second column address decoder 12b continues inputting IO7(A0:0) in the most significant bit to the sense amplifier SA_M1. The second column address decoder 12b inputs IO6(A0:0) of the subsequent bit to the sense amplifier SA_M0 instead of IO7(A0:1) that is not selected eventually.

The selectors 13 and 14 output data read out by the sense amplifiers SA_M0 and SA_M1 to the shift register 15. For example, when the column address signal A0 is established to be "0", the selector 13 outputs the data IO7(A0:0), which is read out by the sense amplifier SA_M1, to the shift register 15 as the most significant bit data.

The data IO6(A0:0) is subsequently read out by the sense amplifier SA_M0 and outputted by the selector 14 to the shift register 15 as the subsequent bit data. The other data IO0-IO5 read out by the other sense amplifiers SA0-SA5 are outputted to the shift register 15 at the same time as IO6.

The shift register 15 takes-in and stores the data outputted from the sense amplifiers SA0-SA5, SA_M0 and SA_M1, and shifts and outputs the stored data IO0-IO7 in synchronization with the external clock CLK. In this case, the data IO7-IO0 are outputted in the order of IO7→IO6→IO5→IO4→IO3→IO2→IO1→IO0.

Figure 2D:
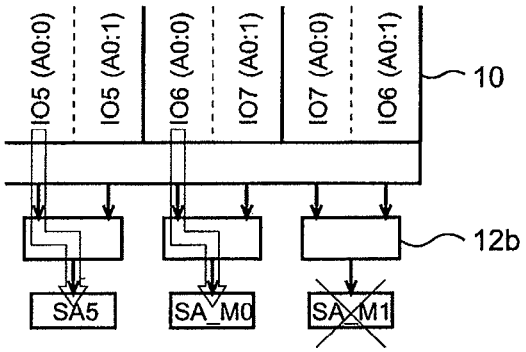
Figure 3:
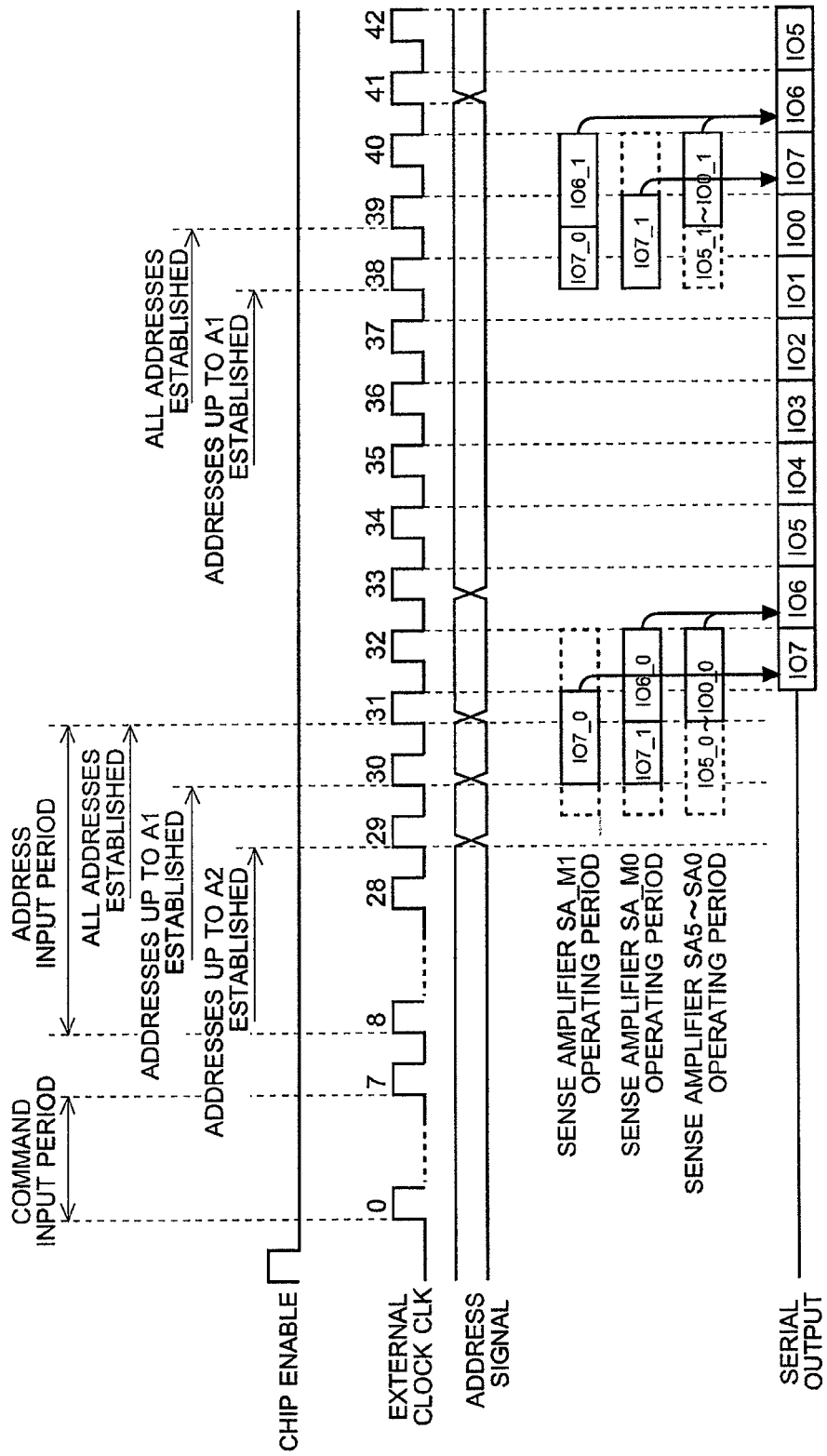
FIG. 3 is a timing chart to explain the operations of the EEPROM according to the first embodiment of this invention.

Next, example operations of the EEPROM 100 are explained referring to FIG. 2A through FIG. 3. In the timing chart shown in FIG. 3, IO7(A0:0) is abbreviated to IO7_0, and IO7(A0:1) is abbreviated to IO7_1. Other names such as IO6(A0:0) are also abbreviated in the same way as described above.

First, the EEPROM 100 is put into operation when a chip enable signal is inputted. A period ranging from a clock pulse 0 to a clock pulse 7 of the external clock CLK (from a rising edge of the clock pulse 0 to a rising edge of the clock pulse 7) is a command input period during which a read-out command is inputted to the EEPROM 100 in synchronization with the external clock CLK.

The following period ranging from a clock pulse 8 through a clock pulse 31 (from a rising edge of the clock pulse 8 to a rising edge of the clock pulse 31) is an address signal input period during which the row address signal is serially inputted to the row address decoder 11 and thereafter the column address signal Ai is serially inputted to the column address decoder 12 in synchronization with the external clock CLK.

In this case, the column address signal A2 is established in synchronization with a rising edge of a clock pulse 29, the column address signal A1 is established in synchronization with a rising edge of a subsequent clock pulse 30, and the least significant bit column address signal A0 is established in synchronization with a rising edge of the subsequent clock pulse 31 to establish the entire read-out address.

The operations of the EEPROM 100 are hereafter described in the order of establishing of each of the bits of the column address signal Ai.

(a) Phase 1 (Before Establishing A1)

In the phase 1, the eight sense amplifiers SA0-SA5, SA_M0 and SA_M1 and the column address decoder 12 are in a non-operating state, because there are four or more than four candidate read-out addresses (Refer to FIG. 2A.).

(b) Phase 2 (After Establishing A1 and Before Establishing A0)

In the phase 2, the second column address decoder 12b connects the bit line BL0, that corresponds to IO7(A0:0) in the memory block MIX1, to the input terminal of the sense amplifier SA_M1 and connects the bit line BL1, that corresponds to IO7(A0:1) in the memory block MIX0, to the input terminal of the sense amplifier SA_M0. At that time, each of the sense amplifiers SA_M0 and SA_M1 is put into operation, and commences reading each of the candidate data IO7(A0:1) and IO7(A0:0) for the first bit, respectively. This is the read-ahead operation performed before the entire address is established. Meantime, the sense amplifiers SA0-SA5 are in the non-operating state (Refer to FIG. 2B.).

(c) Phase 3 (After Establishing A0 and Before Outputting the Data IO7)

In the phase 3, the least significant bit column address signal A0 is established. When A0=0, for example, the second column address decoder 12b continues inputting the data IO7(A0:0) to the sense amplifier SA_M1 as in the phase 2. The sense amplifier SA_M1 continues reading out the data IO7(A0:0).

And the selector 13 inputs the data IO7(A0:0) read out by the sense amplifier SA_M1 to the shift register 15.

The second column address decoder 12b inputs the subsequent bit data IO6(A0:0) to the sense amplifier SA_M0 instead of the data IO7(A0:1), that is not selected eventually, by connecting the bit line BL0 corresponding to the data IO6(A0:0) to the input terminal of the sense amplifier SA_M0. With this, the sense amplifier SA_M0 commences reading out the data IO6(A0:0).

Also, the second column address decoder 12b inputs each of the data IO0(A0:0)-IO5(A0:0) to corresponding each of the sense amplifiers SA0-SA5. Each of the sense amplifiers SA0-SA5 is put into operation and commences reading out corresponding each of the inputted data IO0(A0:0)-IO5(A0:0), respectively (Refer to FIG. 2C.).

(d) Phase 4 (Outputting the Data IO7-Outputting the Data IO6)

In the phase 4, the first bit data IO7(A0:0) is outputted from the shift register 15 in synchronization with a falling edge of the clock pulse 31. The sense amplifier SA_M1 halts its operation since it has completed the read-out operation.

On the other hand, each of the sense amplifiers SA0-SA5 and SA_M0 continues reading out corresponding each of the data IO0(A0:0)-IO6(A0:0), respectively (Refer to FIG. 2D.).

The selector 14 inputs the data IO6(A0:0) read out by the sense amplifier SA_M0 to the shift register 15. The data IO0(A0:0)-IO5(A0:0) read out by the sense amplifiers SA0-SA5 are inputted to the shift register 15. Then, the data IO6(A0:0) is outputted in synchronization with a falling edge of a clock pulse 32, and thereafter the data IO5(A0:0)-IO0(A0:0) are outputted sequentially.

In the serial interface memory device, the read-out operation continues thereafter as long as the external clock CLK is inputted, while the serially inputted address is increased in increments of one. For example, the address in an internal address register is increased by one in synchronization with a rising edge of a clock pulse 33, as shown in FIG. 3. When the column address signal A0 inputted serially in synchronization with the external clock CLK is "0", for example, the column address signal A0 becomes "1" in the subsequent address that is increased by one. Therefore, the sense amplifier SA_M0 is put into operation in synchronization with a rising edge of a clock pulse 38 to commence the read-out operation.

After that, the sense amplifier SA_M1 commences reading out IO6(A0:1) in synchronization with a rising edge of a clock pulse 39. Each of the sense amplifiers SA0-SA5 is also put into operation and commences reading out corresponding each of the inputted data IO0(A0:1)-IO5(A0:1), respectively. The data IO7(A0:1) is outputted from the shift register 15 in synchronization with a falling edge of the clock pulse 39. After that, the data IO6(A0:1) is outputted in synchronization with a falling edge of a clock pulse 40, and thereafter the data IO5(A0:1)-IO0(A0:1) are outputted one after another.

In the EEPROM 100, as described above, each of the sense amplifiers SA_M0 and SA_M1 commences reading out each of the candidate data IO7(A0:1) and IO7(A0:0) for the first bit, respectively, when the column address up to the column address signal A1 is established. After that, when the least significant bit column address signal A0 is established, that is, when the entire address is established, the sense amplifier SA_M1 continues reading out IO7(A0:0) that is eventually selected, while the sense amplifier SA_M0 commences reading out the subsequent bit data IO6(A0:0) instead of IO7(A0:1) that is eventually not selected. With this, the read-out time of 1.5 clock periods (1.5 times of one clock period) can be secured for the first bit data IO7(A0:0) that is to be outputted first.

The read-out time of 1.5 clock periods can be secured for the subsequent bit data IO6(A0:0), since it is sufficient that IO6(A0:0) is outputted in synchronization with the falling edge of the subsequent clock pulse 32. Also, the read-out time equal to or longer than 1.5 clock periods can be secured for the data IO5(A0:0)-IO0(A0:0), since reading out the data IO5(A0:0)-IO0(A0:0) commences at the same time as reading out the data IO6(A0:0).

Therefore, the read-out rate of the data can be increased by increasing the clock rate with the EEPROM 100, since the read-out time of 1.5 clock periods can be secured for all the serial output data IO0-IO7.

In addition, eight sense amplifiers, which are the same number of sense amplifiers as the data width of eight bits, are sufficient because the sense amplifier SA_M0 used to read out the subsequent bit data IO6(A0:0) is also used to read out the candidate data IO7(A0:1) when the two candidate data for the first bit IO7(A0:1) and IO7(A0:0) are read out. To generalize the above, when the data width is N bits, the number of sense amplifiers required is N (N is a natural number equal to or larger than two.). Thus, the number of sense amplifiers is suppressed to the minimum, and an increase in the size of the circuit can be suppressed.

Figure 4:
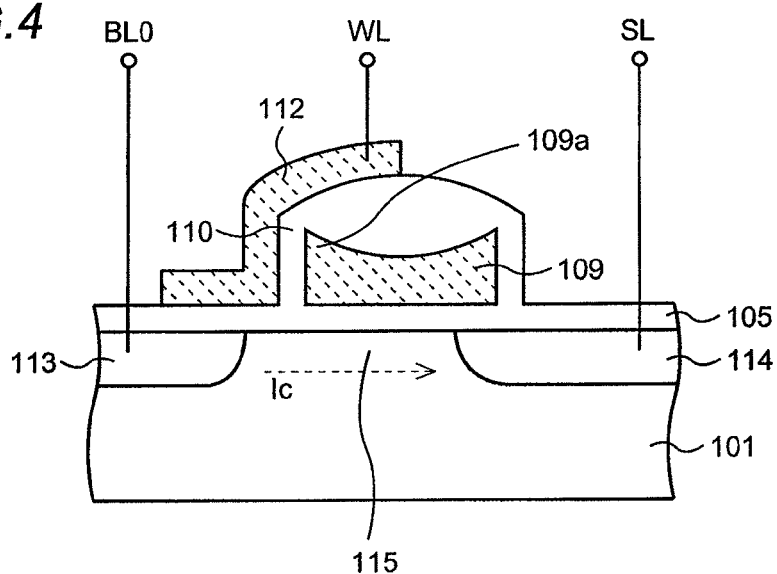
FIG. 4 is a cross-sectional view showing a split-gate type memory cell.

An example of a concrete structure of the memory cell MC0 (also MC1) is hereafter described referring to FIG. 4. The memory cell MC0 is a split-gate type memory cell in which a channel region 115 is formed between a drain region 113 and a source region 114 that are formed on a semiconductor substrate 101 with a predetermined spacing.

There is formed a floating gate 109 extending from above a portion of the channel region 115 to above a portion of the source region 114 through a gate insulation film 105. There is formed a control gate 112 covering a top surface and a side surface of the floating gate 109 through a tunnel insulation film 110 and extending to above a portion of the drain region 113.

The drain region 113 is connected to the corresponding bit line BL0, the control gate 112 is connected to the corresponding word line WL, and the source region 114 is connected to the corresponding source line SL.

Next, operations of the memory cell MC0 are explained. When data is to be written-in, predetermined voltages are applied to the control gate 112 and the source region 114 (12 V to the control gate 112 and 12 V to the source region 114, for example) while the drain region 113 is grounded, and an electric current is fed through the channel region 115 so that thermal electrons are injected into and stored in the floating gate 109.

When the data is to be erased, a high voltage (15 V, for example) is applied from the word line WL to the control gate 112 while the drain region 113 and the source region 114 are grounded, so that the electrons stored in the floating gate 109 are extracted to the control gate 112 as a Fowler-Nordheim tunneling current (hereafter referred to as a FN tunneling current). Since a sharp projection 109a is formed at an upper corner of the floating gate 109, electric field convergence is caused there to make it possible to induce the FN tunneling current at a lower voltage.

When the data stored in the memory cell MC0 is to be read out, predetermined voltages are applied to the control gate 112 and the drain region 113 (3 V to the control gate 112 and 1 V to the drain region 113, for example) while the source region 114 is grounded. Then, a cell current Ic corresponding to an amount of the electric charges of the electrons stored in the floating gate 109 flows between the source region 114 and the drain region 113. When the written-in data is "0", the cell current Ic is reduced because a threshold voltage of the memory cell MC0 is increased. When the written-in data is "1", the cell current Ic is increased because the threshold voltage of the memory cell MC0 is reduced.

The sense amplifiers SA0-SA5, SA_M0 and SA_M1 judge whether the data stored in the memory cell MC0 is "0" or "1" based on the cell current Ic.

Figure 5:
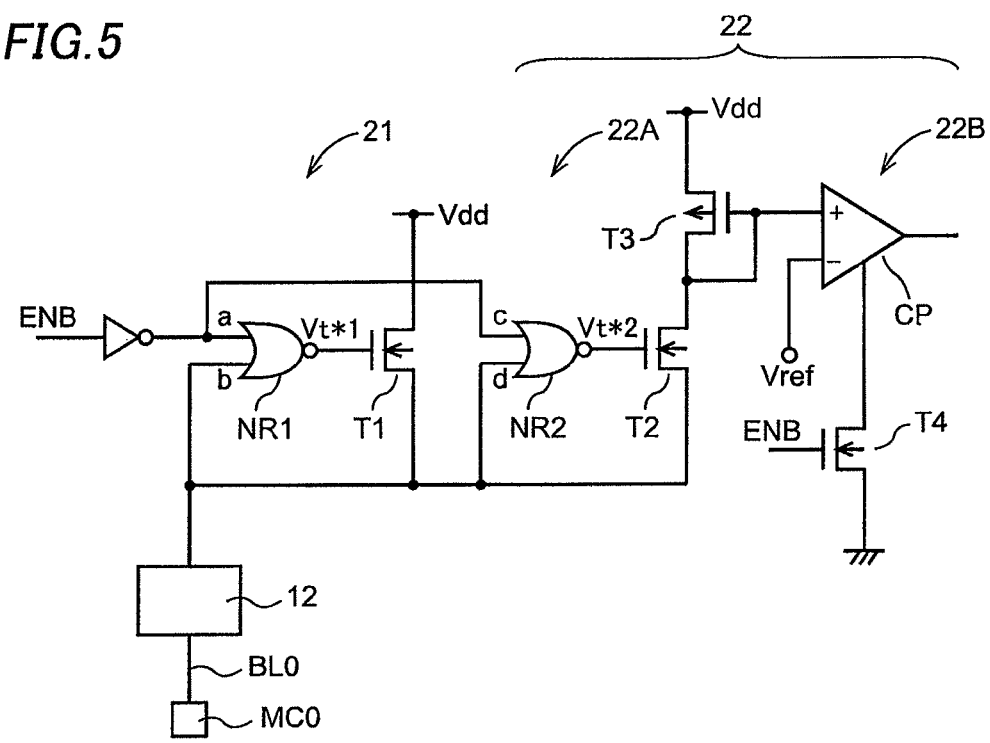
FIG. 5 shows a structure of a sense amplifier.

An example of a concrete structure of the sense amplifiers SA0-SA5, SA_M0 and SA_M1 is explained referring to FIG. 5. Each of the sense amplifiers SA0-SA5, SA_M0 and SA_M1 is formed to include a pre-charging portion 21 and a sensing portion 22.

The pre-charging portion 21 is formed of a first NOR circuit NR1 and an N channel type transistor T1, to a gate of which an output of the first NOR circuit NR1 is applied. An inverse signal of a sense amplifier enable signal ENB is inputted to a first input terminal a of the first NOR circuit NR1, and a source of the N channel type transistor T1 is connected to a second input terminal b of the first NOR circuit NR1. A power supply voltage Vdd is applied to a drain of the N channel type transistor T1. A first threshold voltage of the first NOR circuit NR1 seen from the second input terminal b is denoted as Vt*1.

When the column address decoder 12 selects the bit line BL0 and the memory cell MC0, the second input terminal b of the first NOR circuit NR1 is connected to the memory cell MC0 through the bit line BL0.

The sensing portion 22 is composed of a pre-sense amplifier 22A and a main sense amplifier 22B. The pre-sense amplifier 22A is formed of a second NOR circuit NR2, an N channel type transistor T2, to a gate of which an output of the second NOR circuit NR2 is applied, and a P channel type transistor T3 that is connected with the N channel type transistor T2 in series. The power supply voltage Vdd is applied to a source of the P channel type transistor T3, and a gate and a drain of the P channel type transistor T3 are connected to a drain of the N channel type transistor T2.

The inverse signal of the sense amplifier enable signal ENB is inputted to a first input terminal c of the second NOR circuit NR2, and a source of the N channel type transistor T2 is connected to a second input terminal d of the second NOR circuit NR2. The second input terminal d of the second NOR circuit NR2 is connected to the bit line BL0 through the column address decoder 12. A second threshold voltage of the second NOR circuit NR2 seen from the second input terminal d is denoted as Vt*2. The first and second threshold voltages Vt*1 and Vt*2 are set to satisfy an inequality Vt*2>Vt*1.

The main sense amplifier 22B is formed of a differential amplifier having a non-inverting input terminal (+) to which a voltage at the drain of the N channel type transistor T2 is inputted and an inverting input terminal (−) to which a reference voltage Vref is inputted. The reference voltage Vref is set to be an intermediate voltage between Vt*1 and Vt*2 (Vt*1<Vref<Vt*2).

An N channel type transistor T4, to a gate of which the sense amplifier enable signal ENB is applied, is connected to the main sense amplifier 22B. The main sense amplifier 22B is configured to be put into an active state by being provided with the ground voltage when the sense amplifier enable signal ENB is at an H level (high level), and put into inactive state by being cut off from the ground when the sense amplifier enable signal ENB is at an L level (low level).

Figure 6:
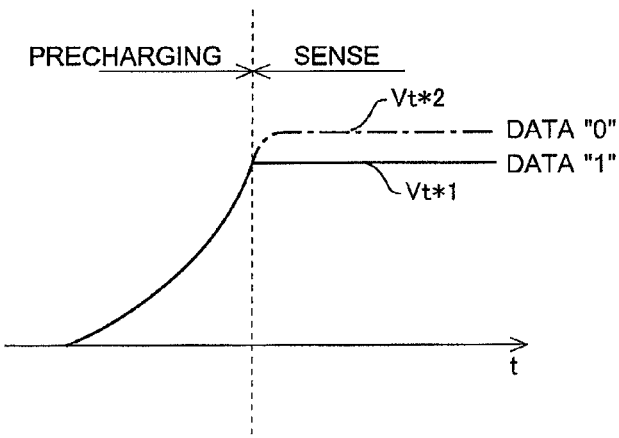
FIG. 6 is a signal waveform chart to explain example operations of the sense amplifier.
Figure 7:
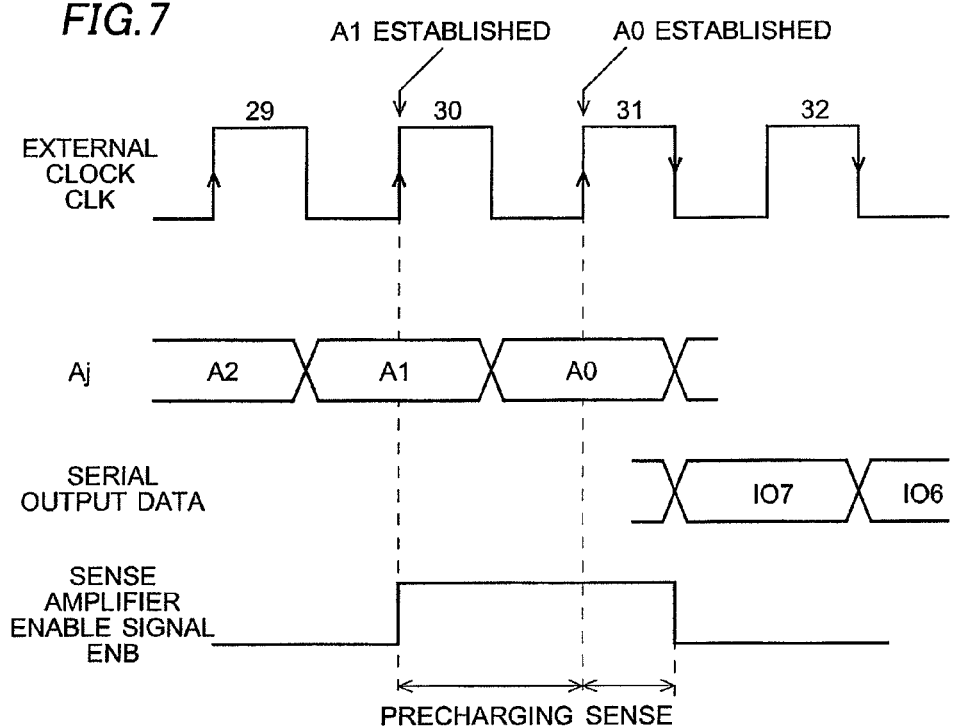
FIG. 7 is a timing chart to explain the example operations of the sense amplifier.

Next, operations of the sense amplifier SA_M1 in the case where the least significant bit column address signal A0 is established to be "0" are explained referring to FIG. 6 and FIG. 7. It is assumed that a voltage on the bit line BL0 is initially set to 0 V by the time when pre-charging begins.

The column address signal A1 is established in synchronization with the rising edge of the clock pulse 30 of the external clock CLK. With this, the memory cell MC0 is connected to the pre-charging portion 21 in the sense amplifier SA_M1 through the column decoder 12. In this case, the candidate data IO7(A0:0) for the first bit is stored in the memory cell MC0, as described above.

Also, the sense amplifier enable signal ENB rises to the H level in synchronization with the rising edge of the clock pulse 30 (Refer to FIG. 7.). Then, the output of the first NOR circuit NR1 turns to the H level, and the N channel type transistor T1 is turned on accordingly. Since the power supply voltage Vdd is applied to the drain of the N channel type transistor T1, the bit line BL0 is quickly charged through the N channel type transistor T1 until the voltage on the bit line BL0 reaches Vt*1.

Since the output of the first NOR circuit NR1 turns from the H level to the L level when the bit line BL0 is pre-charged to the voltage equal to or higher than Vt*1, the N channel type transistor T1 is turned off to terminate the pre-charging by the pre-charging portion 21.

The pre-sense amplifier 22A begins pre-sensing operation after the termination of the pre-charging by the pre-charging portion 21. Since the cell current Ic of the memory cell MC0 is increased in the case where the data in the memory cell MC0 is "1" as described above, it works to reduce the voltage on the bit line BL0 at that time.

On the other hand, the N channel type transistor T2 is turned on (The P channel type transistor T3 is also turned on.) and works to raise the voltage on the bit line BL0, since the output of the second NOR circuit NR2 is at the H level because the voltage at the second input terminal d is lower than Vt*2. The work to reduce the voltage on the bit line BL0 and the work to raise it cancel each other out, so that the voltage on the bit line BL0 is settled to a voltage around Vt*1, which is the pre-charged voltage.

In the case where the data in the memory cell MC0 is "0", on the other hand, the N channel type transistor T2 in a ON state raises the voltage on the bit line BL0, since the cell current Ic of the memory cell MC0 is reduced as described above. When the voltage on the bit line BL0 becomes equal to or higher than Vt*2, however, the N channel type transistor T2 is turned off because the output of the second NOR circuit NR2 is reversed from the H level to the L level. As a result, the voltage on the bit line BL0 is settled to a voltage around Vt*2.

To summarize the operations described above, the voltage on the bit line BL0 becomes the voltage around Vt*1 in the case where the data in the memory cell MC0 is "1", while the voltage on the bit line BL0 becomes the voltage around Vt*2 in the case where the data in the memory cell MC0 is "0", and the voltage on the bit line BL0 appears at the drain of the N channel type transistor T2 (Refer to FIG. 6.).

Therefore, whether the data in the memory cell MC0 is "0" or "1" can be judged by sensing the voltage on the bit line BL0 with the main sense amplifier 22B. That is, the main sense amplifier 22B outputs the H level when the data in the memory cell MC0 is "1", and outputs the L level when the data in the memory cell MC0 is "0".

As described above, the sense amplifier SA_M1 begins pre-charging operation in synchronization with the rising edge of the clock pulse 30, and performs sensing operation thereafter. It is sufficient that the sensing operation is completed by the falling edge of the clock pulse 31. A sum of a pre-charging period and a sensing period makes an operation period T1 (1.5 clock periods) of the sense amplifier SA_M1.

The data IO7 from the sense amplifier SA_M1 is outputted from the shift register 15 in synchronization with the falling edge of the clock pulse 31 (Refer to FIG. 7.).

On the other hand, although the sense amplifier SA_M0 also begins pre-charging operation in synchronization with the rising edge of the clock pulse 30, the bit line BL1 corresponding to IO7(A0:1) in the memory block MIX0, which is not selected eventually, is cut off, and the bit line BL0 corresponding to IO6(A0:0) in the memory block MIX0 is connected instead, and the sense amplifier SA_M0 begins pre-charging operation in synchronization with the rising edge of the clock pulse 31 and performs sensing operation thereafter.

Although the sense amplifiers SA0-SA5 operate similarly, their operations differ in that they begin the operations after the least significant bit column address signal A0 is established. That is, the sense amplifier enable signal ENB corresponding to the sense amplifiers SA0-SA5 rises to the H level in synchronization with the rising edge of the clock pulse 31.

A serial interface EEPROM 100A according to a second embodiment of this invention will be described referring to the drawings. While the two candidate data IO7(A0:1) and IO7(A0:0) for the first bit are read out simultaneously when the column address signal A1 is established in the first embodiment, reading out four candidate data IO7(A1,A0:0,0), IO7(A1,A0:0,1), IO7(A1,A0:1,0) and IO7(A1,A0:1,1) for the first bit is commenced when the column address signal A2 is established (A1 and A0 are not established yet) in the second embodiment. IO7(A1,A0:0,0) represents data corresponding to the address where A1=0 and A0=0, for example.

An overall structure of the EEPROM 100A will be described referring to FIG. 8. The EEPROM 100A is formed to include a memory cell array 10A, a row address decoder 11, a column address decoder 12, eight sense amplifiers SA0-SA3, SA_M0, SA_M1, SA_M2 and SA_M3 to read out data, selectors 13a-13d, and a shift register 15.

The column address decoder 12 is composed of a first column address decoder 12a and a second column address decoder 12b. The structure of each of the sense amplifiers and the structure of the memory cell in the EEPROM 100 according to the first embodiment may be used for each of the sense amplifiers SA0-SA3, SA_M0, SA_M1, SA_M2 and SA_M3 and a memory cell, respectively, in the EEPROM 100A according to the second embodiment.

The memory cell array 10A has eight memory blocks MB0-MB3 and MIX0-MIX3. In the memory blocks MB0-MB3, there are disposed memory cells each corresponding to each of data IO0-IO3, respectively. In the memory blocks MIX0-MIX3, on the other hand, there are disposed memory cells corresponding to the data IO4-IO7 in cross combination. Since structures of the memory cells, bit lines and the like are the same as those in the first embodiment, they are omitted from FIG. 8.

The second column address decoder 12b is configured to select one each out of four data in each of the memory blocks MB0-MB3 and MIX0-MIX3, and input the selected data to corresponding each of the sense amplifiers SA0_SA3, SA_M0, SA_M1, SA_M2 and SA_M3, respectively. Each of the selectors 13a-13d is configured to selectively input the data read out from corresponding each of the sense amplifiers SA_M0, SA_M1, SA_M2 and SA_M3, respectively, to the shift register 15.

Figure 8:
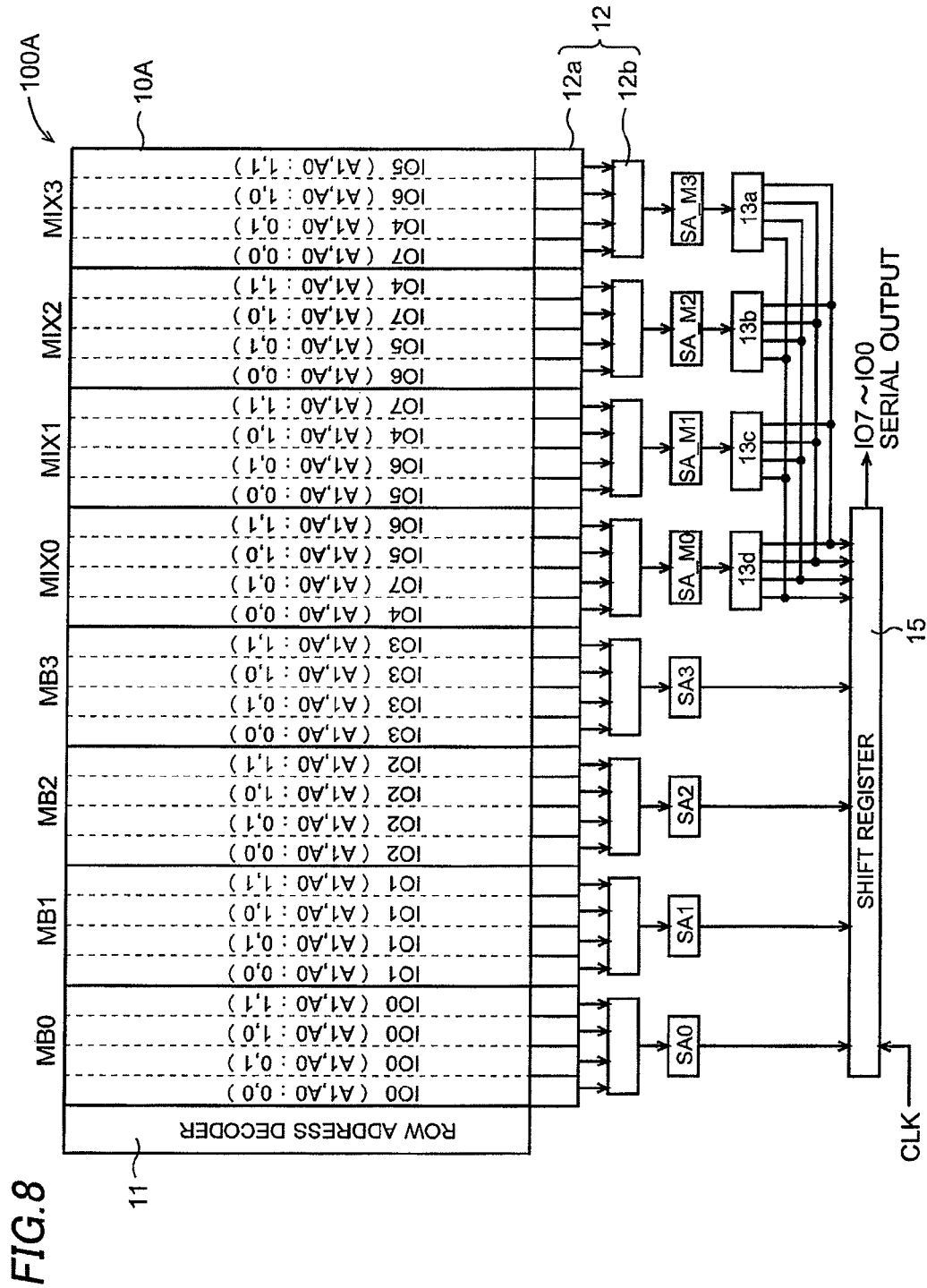
FIG. 8 shows a structure of an EEPROM according to a second embodiment of this invention.

Next, example operations of the EEPROM 100A are explained referring to FIG. 8 and FIG. 9. In the timing chart shown in FIG. 9, IO7(A1,A0:0,0) is abbreviated to IO7_00, and IO7(A1,A0:0,1) is abbreviated to IO7_01. Other names are also abbreviated in the same way as described above.

As the EEPROM 100 according to the first embodiment, the EEPROM 100A is put into operation when the chip enable signal is inputted. A period ranging from a clock pulse 0 to a clock pulse 7 of the external clock CLK (from a rising edge of the clock pulse 0 to a rising edge of the clock pulse 7) is a command input period during which a read-out command is inputted to the EEPROM 100A in synchronization with the external clock CLK.

A subsequent period ranging from a clock pulse 8 through a clock pulse 31 (from a rising edge of the clock pulse 8 to a rising edge of the clock pulse 31) is an address signal input period during which the row address signal is serially inputted to the row address decoder 11 and subsequently the column address signal Ai is serially inputted to the column address decoder 12 in synchronization with the external clock CLK.

In this case, the column address signal A2 is established in synchronization with a rising edge of a clock pulse 29, the column address signal A1 is established in synchronization with a rising edge of a subsequent clock pulse 30, and the least significant bit column address signal A0 is established in synchronization with the rising edge of the clock pulse 31 to establish the entire read-out address.

When the column address signal A2 is established in synchronization with the rising edge of the clock pulse 29, there exist the four candidate data IO7(A1,A0:0,0), IO7(A1,A0:0,1), IO7(A1,A0:1,0) and IO7(A1,A0:1,1) for the first bit. The second column address decoder 12b inputs each of the four candidate data to corresponding each of the sense amplifiers SA_M3, SA_M2, SA_M1 and SA_M0, respectively. With this, reading out the four candidate data commences simultaneously.

After that, in the case where the column address signal A1 is established to be "0" in synchronization with the rising edge of the clock pulse 30, each of the sense amplifiers SA_M3 and SA_M0 continues reading out each of the remaining candidate data IO7(A1,A0:0,0) and IO7(A1,A0:0,1), respectively. On the other hand, the sense amplifiers SA_M2 and SA_M1 commence reading out candidate data IO6(A1,A0:0,0) and IO6(A1,A0:0,1) for the subsequent bit instead of IO7(A1,A0:1,0) and IO7(A1,A0:1,1) that have been eliminated from the candidate data for the first bit.

After that, in the case where the least significant bit column address signal A0 is established to be "0" in synchronization with the rising edge of the clock pulse 31, the sense amplifier SA_M3 continues reading out IO7(A1,A0:0,0) that is the data eventually selected. On the other hand, the sense amplifier SA_M0 commences reading out data IO4(A1,A0:0,0) instead of IO7(A1,A0:0,1) that has been eliminated from the candidate for the first bit. The sense amplifier SA_M2 continues reading out the data IO6(A1,A0:0,0). The sense amplifier SA_M1 commences reading out data IO5(A1,A0:0,0) instead of IO6(A1,A0:0,1) that has been eliminated from the candidate for the subsequent bit. Also, each of the sense amplifiers SA3-SA0 commences reading out each of data IO3(A1,A0:0,0)-IO0(A1,A0:0,0), respectively.

Then, the first bit data IO7(A1,A0:0,0) is outputted in synchronization with the rising edge of the clock pulse 31, and the data IO6(A1,A0:0,0) is outputted in synchronization with a falling edge of a clock pulse 32. Similarly, the data IO5(A1,A0:0,0)-IO0(A1,A0:0,0) are outputted serially thereafter.

As described above, with the EEPROM 100A according to the second embodiment, the read-out time of 2.5 clock periods, which is longer than the read-out time in the first embodiment by 1 clock period, can be secured as the read-out time for each bit of the data, since reading out the four candidate data for the first bit is commenced when the column address signal A2 is established. The number of sense amplifiers is eight, which is the same number as in the first embodiment.

It is also possible based on the similar idea that reading out eight candidate data for the most significant bit is commenced when the column address signal A3 is established. In that case, the read-out time of 3.5 clock periods can be secured.

It is apparent that this invention is not limited to the embodiments described above and may be modified within the scope of the invention. For example, although the EEPROMs 100 and 100A have the data width of eight bits, the data width may be modified to N bits (N is a natural number equal to or larger than two.) as described above. Also, the number of bits of the column address signal may be set to M bits in accordance with a size of the memory in general. The structures of the memory cell array 10, the row address decoder 11, the column address decoder 12 and the like are modified accordingly, while the number of the sense amplifiers is modified to N that is the same number as the data width.

When (M–X) bits of address signal are established, the column address decoder 12 commences reading out $2^X$ candidate data for the first bit by selecting the $2^X$ candidate data for each of N bits corresponding to the (M–X) bits of the address signal and inputting each of the $2^X$ candidate data for the first bit to each of $2^X$ sense amplifiers. In this case, X is a natural number equal to or larger than 1 and equal to or smaller than M–1.

When all M bits of the address signal are established, the column address decoder 12 selects one out of the $2^X$ candidate data as eventual data corresponding to the established address signal, and continues inputting the selected one of the candidate data to one of the sense amplifiers as well as inputting data for each of the other (N–1) bits to corresponding each of the other (N–1) read-out circuits, respectively. With this, the read-out rate of the data can be increased, while an increase in the number of the sense amplifiers is suppressed.

The serial interface EEPROMs 100 and 100A having split gate type memory cells are described as the examples in the embodiments. Not limited to the above, this invention may be widely applied to other serial interface semiconductor memory devices such as a ROM, a RAM, and the like.

With the serial interface memory device according to the embodiments of this invention, the read-out rate of the data can be increased, while an increase in the size of the circuit is suppressed.

What is claimed is:

1. A memory device comprising:
a memory cell array storing data comprising a first bit and lower bits;
an address decoder selecting an address of the memory cell array corresponding to an address signal comprising most significant bits and less significant bits and serially inputted in synchronization with a clock;
a plurality of read-out circuits, each corresponding to a bit of the data, respectively; and
a shift register serially outputting data from the first bit in synchronization with the clock, the data being read out from the plurality of read-out circuits,
wherein the address decoder inputs candidate bit data of a predetermined number for the first bit, which determined by the most significant bits, to corresponding read-out circuits of the predetermined number, before the less significant bits of the address signal are established, so that reading out the candidate bit data of the predetermined number is commenced before all bits of the address signal are established, and
the read-out circuits of the predetermined number are configured to read not only the candidate bit data but also the same number of lower bits of the data stored in the memory cell as the predetermined number.

2. The memory device of claim 1, wherein the read-out circuits of the predetermined number comprises a first read-out circuit and a second read-out circuit, and the address decoder selects first and second candidate bit data for the first bit in accordance with the address signal and inputs the first candidate bit data to the first read-out circuit and the second candidate bit data to the second read-out circuit when all bits except for a last bit of the address signal are established.

3. The memory device of claim 2, wherein the address decoder continues inputting the first candidate bit data to the first read-out circuit and inputs data of a subsequent bit to the second read-out circuit when all bits of the address signal are established and the first candidate bit data is selected as eventual data in accordance with the address signal.

4. The memory device of claim 1, wherein the address decoder inputs each of four candidate bit data for the first bit to each of four of the read-out circuits, respectively, when all bits except for last two bits of the address signal are established.

5. A memory device comprising:
a memory cell array storing data, the data having a data width of N bits comprising a first bit and lower bits;
an address decoder selecting an address of the memory cell array corresponding to an address signal of M bits comprising most significant bits and less significant bits and serially inputted in synchronization with a clock;
N read-out circuits each corresponding to a bit of the data, respectively; and
a shift register serially outputting data from the first bit in synchronization with the clock, the data being read out from the N read-out circuits,
wherein the address decoder selects $2^X$ candidate bit data for each of the N bits in accordance with (M–X) most significant bits of the address signal and inputs each of the $2^X$ candidate bit data for the first bit to each of $2^X$ read-out circuits out of the N read-out circuits, respectively, when the (M–X) most significant bits of the address signal are established, so that reading out the $2^X$ candidate bit data is commenced when the (M–X) most significant bits of the address signal are established, X being a natural number equal to or larger than 1 and equal or smaller than M–1, and
the $2^X$ read-out circuits are configured to read not only the candidate bit data but also $2^X$ lower bits of the N bit data.

6. The memory device of claim 5, wherein the address decoder selects one out of the $2^X$ candidate bit data in accordance with all bits of the address signal and continues inputting the selected one of the candidate bit data to one of the read-out circuits and inputs data for each of the other (N–1) bits to each of the other (N–1) read-out circuits, respectively, when all bits of the address signal are established.

7. The memory device of claim 1, wherein the predetermined number of candidate bit data is smaller than the number of the plurality of read-out circuits.

8. The memory device of claim 5, wherein $2^X$ is smaller than N.

9. The memory device of claim 1, further comprising a selector that selects a candidate bit data when all bits of the address signal are established, wherein the selector is connected to the read-out circuits of the predetermined number and is not connected to the read-put circuits other than the read-out circuits of the predetermined number.

10. The memory device of claim 5, further comprising a selector that selects a candidate bit data when all bits of the address signal are established, wherein the selector is connected to the $2^X$ read-out circuits and is not connected to the read-put circuits other than the $2^X$ read-out circuits.

* * * * *